United States Patent
Jenei et al.

(10) Patent No.: US 12,074,114 B2
(45) Date of Patent: Aug. 27, 2024

(54) CHIP FABRICATION METHOD AND PRODUCT INCLUDING RAISED AND RECESSED ALIGNMENT STRUCTURES

(71) Applicant: IQM FINLAND OY, Espoo (FI)

(72) Inventors: Máté Jenei, Espoo (FI); Kok Wai Chan, Espoo (FI); Kuan Yen Tan, Espoo (FI)

(73) Assignee: IQM Finland OY, Espoo (FI)

( * ) Notice: Subject to any disclaimer, the term of this patent is extended or adjusted under 35 U.S.C. 154(b) by 0 days.

(21) Appl. No.: 18/503,673

(22) Filed: Nov. 7, 2023

(65) Prior Publication Data

US 2024/0071944 A1 Feb. 29, 2024

Related U.S. Application Data

(63) Continuation of application No. PCT/FI2021/050615, filed on Sep. 17, 2021.

(51) Int. Cl.
| | | |
|---|---|---|
| *H01L 23/544* | (2006.01) | |
| *H01L 21/768* | (2006.01) | |
| *H01L 23/00* | (2006.01) | |
| *H01L 23/48* | (2006.01) | |
| *H01L 25/00* | (2006.01) | |

(52) U.S. Cl.
CPC ...... *H01L 23/544* (2013.01); *H01L 21/76898* (2013.01); *H01L 23/481* (2013.01); *H01L 24/16* (2013.01); *H01L 24/81* (2013.01); *H01L 2223/54426* (2013.01); *H01L 2224/16145* (2013.01); *H01L 2224/8113* (2013.01)

(58) Field of Classification Search
CPC ............. H01L 23/544; H01L 21/76898; H01L 23/481; H01L 24/16; H01L 24/81; H01L 2223/54426; H01L 2224/16145; H01L 2224/8113
See application file for complete search history.

(56) References Cited

U.S. PATENT DOCUMENTS

| | | | |
|---|---|---|---|
| 6,114,221 A * | 9/2000 | Tonti | H01L 25/0657 257/E29.022 |
| 7,453,150 B1 | 11/2008 | McDonald | |
| 10,811,588 B2 | 10/2020 | Olivadese et al. | |

(Continued)

FOREIGN PATENT DOCUMENTS

JP   H08125121 A   5/1996

OTHER PUBLICATIONS

International Search Report and Written Opinion issued in PCT/FI2021/050615, mailed Jul. 12, 2022.

(Continued)

*Primary Examiner* — Herve-Louis Y Assouman
(74) *Attorney, Agent, or Firm* — Meunier Carlin & Curfman LLC

(57) ABSTRACT

The invention relates to the field of chip fabrication, in particular to the fabrication of superconducting integrated circuits for use in quantum computers. Raised and recessed alignment structures are provided on the surfaces of two substrate such that the raised and recessed alignment structure extends within the recessed alignment structure to a maximum depth determined by the geometry of the alignment structures. The alignment structures act as a hard stop for positioning and aligning the substrates for flip chip bonding.

18 Claims, 8 Drawing Sheets

(56) References Cited

U.S. PATENT DOCUMENTS

| | | | |
|---|---|---|---|
| 2001/0010743 A1* | 8/2001 | Cayrefourcq | G02B 6/4232 |
| | | | 257/E21.705 |
| 2014/0239979 A1 | 8/2014 | Wygant et al. | |
| 2014/0264287 A1 | 9/2014 | Abraham et al. | |
| 2019/0226933 A1 | 7/2019 | Stewart | |
| 2020/0119251 A1* | 4/2020 | Yohannes | H01L 24/06 |

OTHER PUBLICATIONS

Communication pursuant to Art 94(3) EPC issued in corresponding EP App. No. 21786524.5 mailed on Mar. 13, 2024.

\* cited by examiner

CHIP FABRICATION METHOD AND PRODUCT INCLUDING RAISED AND RECESSED ALIGNMENT STRUCTURES

CROSS-REFERENCE TO RELATED APPLICATIONS

This application is a continuation of International patent application No. PCT/FI2021/050615, filed on Sep. 17, 2021, and entitled, "CHIP FABRICATION METHOD AND PRODUCT," the disclosure of which is expressly incorporated herein by reference in its entirety.

TECHNICAL FIELD

The invention relates to the field of chip fabrication, in particular to the fabrication of superconducting integrated circuits for use in quantum computers.

BACKGROUND

In 3D integrated circuit devices, the integrated circuit components occupy not just a single substrate side, but are distributed on both sides of a substrate and/or on the sides of multiple unified dice, e.g. in a stack. The distribution of circuit components on different layers or design faces provides more flexibility on qubit chip design and also higher component density. However, existing processes for fabricating 3D integrated circuit devices, such as flip chip, do not allow for precise control of the separation of individual chips, the relative orientation of the individual chips (i.e. tilt) or the alignment of individual chips (i.e. lateral offset or rotation).

SUMMARY

According to a first aspect of the invention, a method is provided. The method comprises:
etching a first substrate to form a raised alignment structure that extends above a first surface of the first substrate;
etching a second substrate to form a recessed alignment structure that extends below a first surface of the second substrate; and
positioning the raised alignment structure opposite the recessed alignment structure such that the first surface of the first substrate is opposite and parallel to the first surface of the second substrate and such that the raised alignment structure is positioned at least partially within the recessed alignment structure;
wherein the raised alignment structure and recessed alignment structure are shaped such that the raised alignment structure extends at least partially within the recessed alignment structure to a set depth and such that when the raised alignment structure is positioned within the recessed alignment structure at the set depth, movement of the first substrate is restricted towards the second substrate and relative to the second substrate along at least one axis parallel to the first surfaces of the first and second substrates.

Before positioning the raised alignment structure opposite the recessed alignment structure, the method may further comprise depositing at least one of:
a plurality of flip-chip bumps on at least one of the first surface of the first substrate or first surface of the second substrate; or
an indium film on the raised alignment structure and/or within the recessed alignment structure,
and positioning the raised alignment structure opposite the recessed alignment structure further comprises bonding the first substrate to the second substrate via the flip-chip bumps or indium film.

Bonding the first substrate to the second substrate may comprise thermocompression bonding.

The height of the deposited flip chip bumps may be larger than the separation between the first surface of the first substrate and the first surface of the second substrate when the raised alignment structure is positioned within the recessed alignment structure at the set depth and, following compression bonding, the raised alignment structure may be positioned within the recessed alignment structure at the set depth.

The cross sections of the raised alignment structure and recessed alignment structure along at least one plane perpendicular to the first surfaces of each substrate may be trapezium-shaped such that the cross section of the raised alignment structure is a trapezium extending from the first surface of the first substrate and the cross section of the recessed alignment structure is trapezium extending into the first surface of the second substrate.

The longest base of the raised alignment structure trapezium may be longer than the longest base of the recessed alignment structure trapezium and each leg of the raised alignment structure trapezium may be parallel to the adjacent leg of the recessed alignment structure trapezium when the first surface of the first substrate is parallel to the first surface of the second substrate.

The raised alignment structure and recessed alignment structure may be isosceles trapezium-shaped.

The separation, d, between the first surface of the first substrate and first surface of the second substrate when the raised alignment structure extends within the recessed alignment structure to the set depth may be given by the following equation:

$$d = \tan(\alpha)\frac{B_{raised} - B_{recessed}}{2}$$

where $\alpha$ is the interior angle between the legs and the longest base of each trapezium, $B_{raised}$ is the length of the longest base of the raised alignment structure and $B_{recessed}$ is the length of the longest base of the recessed alignment structure.

The cross sections of the raised alignment structure and recessed alignment structure along two perpendicular planes, each perpendicular to the first surfaces of each substrate, may be trapezium-shaped such that the raised alignment structure is a square or rectangular frustum extending from the first surface of the first substrate and the recessed alignment structure is a square or rectangular frustum-shaped hollow extending into the first surface of the second substrate.

The dimensions of the raised alignment structure and recessed alignment structure may obey the following equation:

$$d = \tan(\alpha)\frac{B_{raised} - B_{recessed}}{2} = \tan(\beta)\frac{C_{raised} - C_{recessed}}{2}$$

where d is the separation between the first surface of the first substrate and first surface of the second substrate when the raised alignment structure extends within the recessed alignment structure to the set depth, α is the interior angle between the legs and the longest base of the trapezia in along a first axis parallel to the first surfaces of the first and second substrates, $B_{raised}$ is the length of the longest base of the trapezium along the first axis of the raised alignment structure along and $B_{recessed}$ is the length of the longest base of the trapezium along the first axis recessed alignment structure, β is the interior angle between the legs and the longest base of the trapezia in along a second axis parallel to the first surfaces of the first and second substrates and perpendicular to the first axis, $C_{raised}$ is the length of the longest base of the trapezium along the second axis of the raised alignment structure along and $C_{recessed}$ is the length of the longest base of the trapezium along the second axis recessed alignment structure.

Etching the first substrate to form a raised alignment structure may comprise:
  forming a hardmask or resist on a first area of the first substrate;
  anistropically etching the first substrate; and
  removing the hardmask or resist.

The size of the first area on which the hardmask or resist is formed, the etching time and/or the etchant concentration may be controlled in order to control the dimensions of the trapezium/frustum shape of the raised alignment structure.

Etching the second substrate to form a recessed alignment structure may comprise:
  forming a hardmask or resist on an upper surface of the second substrate, the hardmask or resist including at least one opening defining an open area of the second substrate;
  anistropically etching the second substrate via the opening in the hardmask or resist; and
  removing the hardmask or resist.

The size of the open area on the second substrate, the etching time and/or the etchant concentration may be controlled in order to control the dimensions of the trapezium/frustum shape of the recessed alignment structure.

Etching a first substrate to form a raised alignment structure may comprise forming multiple raised alignment structures on the first substrate and the step of etching a second substrate to form a recessed alignment structure comprises forming multiple recessed alignment structures on the second substrate.

The first substrate may be a die on a first wafer comprising multiple dies, the second substrate may be a die on a second wafer comprising multiple dies, etching the first substrate to form multiple raised alignment structures may comprise etching the first wafer to form multiple raised alignment structures on each die on the first wafer, and etching the second substrate to form multiple recessed alignment structure may comprise etching the second wafer to form multiple recessed alignment structures on each die on the second wafer.

Etching the first wafer to form multiple raised alignment structures may comprise forming a raised alignment structure in every quadrant of each die on the first wafer and/or etching the second wafer to form multiple recessed alignment structures may comprise forming a recessed alignment structure in every quadrant of each die on the second wafer.

The multiple raised alignment structures may be arranged on the first substrate and the multiple recessed alignment structures may be arranged on the second substrate such that positioning the raised alignment structure opposite the recessed alignment structure comprises positioning each raised alignment structure opposite of the recessed alignment structures such that each raised alignment structure extends at least partially within the opposite recessed alignment structure to the set depth.

The method may further comprise forming quantum circuit components on the first and/or second substrate before the step of positioning the raised alignment structure opposite the recessed alignment structure.

Forming quantum circuit components may comprise:
  forming a qubit on the raised alignment structure;
  forming a through-substrate via in the second substrate, the through-substrate via extending through the second substrate from the recessed alignment structure to a second surface of the second substrate; and
  metallizing the sidewalls of the through-substrate via.

Positioning the raised alignment structure opposite the recessed alignment structure may form a capacitor between the sidewall metallization of the through-substrate via and the qubit formed on the raised alignment structure.

Forming the qubit on the raised alignment structure may comprise forming the qubit on the upper surface of the raised alignment structure.

Forming the through-substrate via may comprise forming a hardmask or resist within the recessed alignment portion and etching the through-substrate via through an opening in the hardmask or resist.

The sidewall metallization may be formed by chemical vapour deposition or physical vapour deposition before the hardmask or resist is removed.

The method may further comprise:
  forming multiple raised alignment structures and multiple recessed alignment structures;
  forming a qubit on the raised alignment structure comprises forming qubits on a first subset of the raised alignment structures;
  forming a through-substrate via comprises forming through-substrate vias extending from a first subset of the recessed alignment structures, the first subset of recessed alignment structures comprising the recessed alignment structures that are positioned opposite raised alignment structures in the first subset of raised alignment structures in the step of positioning; and
  prior to positioning the raised alignment structure opposite the recessed alignment structure, depositing a layer of spacer material on a second subset of the raised alignment structure(s) and/or second subset of the recessed alignment structure(s).

The distance between the first substrate and second substrate following positioning the raised alignment structures opposite the recessed alignment structures may be determined at least in part by the thickness of the layer of spacer material deposited on the second subset of the raised alignment structure(s) and/or second subset of the recessed alignment structure(s).

The method may further comprise forming a metallization on at least the side walls of the raised alignment structure surrounding the qubit and positioning the raised alignment structure opposite the recessed alignment structure may further comprise placing the metallization on the sidewalls of the through-substrate via in electrical contact with the metallization on the sidewalls of the raised alignment structure.

The method may further comprise:
  forming multiple raised alignment structures and multiple recessed alignment structures;

forming a qubit on the raised alignment structure comprises forming qubits on at least two of the raised alignment structures and forming a coupler on at least one of the raised alignment structures;

forming connections elements connecting the at least two qubits to the at least one coupler;

forming a through-substrate via comprises forming through-substrate vias extending from a subset of the recessed alignment structures, the subset of recessed alignment structures comprising the recessed alignment structures that are positioned opposite the raised alignment structures on which the qubits are formed.

The qubit may be a Josephson junction-based qubit, for example a transmon qubit.

According to a second aspect of the invention, a product is provided. The product comprises:

a first substrate comprising at least one raised alignment structure that extends above a first surface of the first substrate; and a second substrate comprising at least one recessed alignment structure that extends below a first surface of the second substrate;

wherein the raised alignment structure is positioned opposite the recessed alignment structure such that the first surface of the first substrate is opposite and parallel to the first surface of the second substrate and such that the raised alignment structure is positioned at least partially within the recessed alignment structure; and wherein the raised alignment structure and recessed alignment structure are shaped such that the raised alignment structure extends at least partially within the recessed alignment structure to a set depth and such that movement of the first substrate is restricted towards the second substrate and relative to the second substrate along at least one axis parallel to the first surfaces of the first and second substrates.

The product may further comprise:

a plurality of flip chip bumps connecting the first surface of the first substrate and the first surface of the second substrate; and/or an indium film on the raised alignment structure and/or within the recessed alignment structure.

The cross sections of the raised alignment structure and recessed alignment structure along at least one axis parallel to the first surfaces of each substrate may be trapezium-shaped such that the cross section of the raised alignment structure is a trapezium extending from the first surface of the first substrate and the cross section of the recessed alignment structure may be a trapezium extending into the first surface of the second substrate.

The longest base of the raised alignment structure trapezium may be longer than the longest base of the recessed alignment structure trapezium and each leg of the raised alignment structure trapezium may be parallel to the adjacent leg of the recessed alignment structure trapezium.

The raised alignment structure and recessed alignment structure may be isosceles trapezium-shaped.

The separation, d, between the first and second substrates when the raised alignment structure extends within the recessed alignment structure to the set depth may be given by the following equation:

$$d = \tan(\alpha)\frac{B_{raised} - B_{recessed}}{2}$$

where $\alpha$ is the interior angle between the legs and the longest base of each trapezium, $B_{raised}$ is the length of the longest base of the raised alignment structure and $B_{recessed}$ is the length of the longest base of the recessed alignment structure.

The cross sections of the raised alignment structure and recessed alignment structure along two perpendicular axes parallel to the first surfaces of each substrate may be trapezium-shaped such that the raised alignment structure is a square or rectangular frustum extending from the first surface of the first substrate and the recessed alignment structure is a square or rectangular frustum-shaped hollow extending into the first surface of the second substrate.

The dimensions of the raised alignment structure and recessed alignment structure may obey the following equation:

$$d = \tan(\alpha)\frac{B_{raised} - B_{recessed}}{2} = \tan(\beta)\frac{C_{raised} - C_{recessed}}{2}$$

where d is the separation between the first surface of the first substrate and first surface of the second substrate when the raised alignment structure extends within the recessed alignment structure to the set depth, $\alpha$ is the interior angle between the legs and the longest base of the trapezia in along a first axis parallel to the first surfaces of the first and second substrates, $B_{raised}$ is the length of the longest base of the trapezium along the first axis of the raised alignment structure along and $B_{recessed}$ is the length of the longest base of the trapezium along the first axis recessed alignment structure, $\beta$ is the interior angle between the legs and the longest base of the trapezia in along a second axis parallel to the first surfaces of the first and second substrates and perpendicular to the first axis, $C_{raised}$ is the length of the longest base of the trapezium along the second axis of the raised alignment structure along and $C_{recessed}$ is the length of the longest base of the trapezium along the second axis recessed alignment structure.

The product may comprise multiple raised alignment structure and multiple recessed alignment structures such that each raised alignment structure extends at least partially within the opposite recessed alignment structure to the set depth.

At least one raised alignment structure and at least one recessed alignment structure may be present in each quadrant of the substrate.

The product may further comprises a qubit on the raised alignment structure, a through-substrate via may extend from the recessed alignment structure to a second surface of the second substrate, and the sidewalls of the through-substrate via may be metallized.

The qubit and sidewall metallization of the through-substrate may be electrodes of a capacitor.

The qubit may be located on the upper surface of the raised alignment structure.

The product comprises multiple raised alignment structures and multiple recessed alignment structures. A qubit may be located on each raised alignment structure in a first subset of the raised alignment structures, through-substrate vias may extend from a first subset of the recessed alignment structures, the first subset of recessed alignment structures comprising the recessed alignment structures that are positioned opposite raised alignment structures in the first subset of raised alignment structures, and a layer of spacer material may be located on a second subset of the raised alignment structure(s) and/or second subset of the recessed alignment structure(s).

The distance between the first substrate and second substrate may be determined by the thickness of the layer of spacer material located on the second subset of the raised alignment structure(s) and/or second subset of the recessed alignment structure(s).

The product may further comprise metallization on at least the side walls of the raised alignment structure surrounding the qubit and the metallization on the sidewalls of the through-substrate via may be in electrical contact with the metallization on the sidewalls of the raised alignment structure.

The product may comprise multiple raised alignment structures and multiple recessed alignment structures, a qubit may be located on at least two of the raised alignment structures and a coupler is located on at least one of the raised alignment structures, connection elements may connect the at least two qubits to the at least one coupler and through-substrate vias may extend from a subset of the recessed alignment structures, the subset of recessed alignment structures comprising the recessed alignment structures that are positioned opposite the raised alignment structures on which the qubits are located.

DETAILED DESCRIPTION

Figure 1:
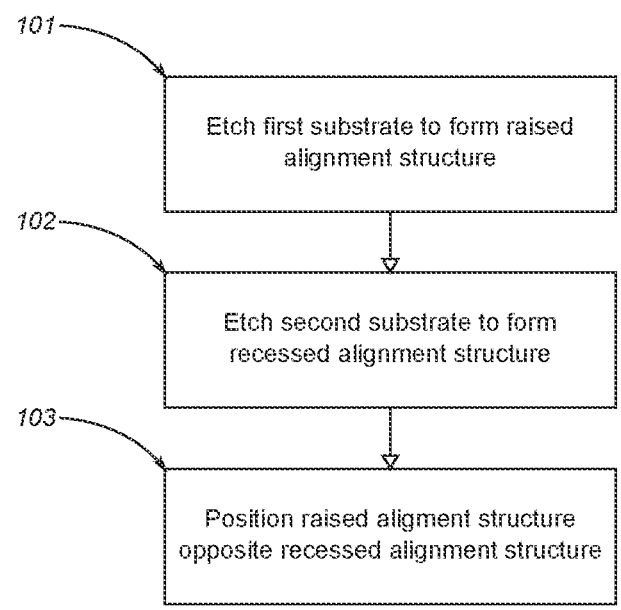
FIG. 1 is a flow chart showing a method according to the present invention.

FIG. 1 is a flow chart showing a method for aligning substrates. The method may be part of a broader process in which components of an integrated circuit device, e.g. a superconducting qubit, are formed on one or more of the substrates. The term "substrate" refers to a base material which may be patterned to form integrated circuit components and structures. A substrate may be a silicon wafer, for example. Where the term "substrate" is used, it may refer to a whole wafer, i.e. the wafer before it is diced, or individual dies. The steps of the method may be performed in multiple regions of each substrate simultaneously in order to form a number of individual, essentially identical dies from each substrate.

At step 101, a first substrate 210 is etched to form a raised alignment structure 201 that extends above a first surface 211 of the first substrate 210. The phrase "extends above" means that the raised alignment structure 201 extends away from the first surface 211 of the first substrate 210 in a direction away from the interior of the substrate 210, such that the raised alignment structure 201 is a protrusion extending from the first surface 211 of the first substrate 210.

At step 102, a second substrate 220 is etched to form a recessed alignment structure 202 that extends below a first surface 221 of the second substrate 220. The phrase "extends below" means that the recessed alignment structure 202 extends away from the first surface 221 of the second substrate 220 in a direction towards the interior of the substrate 220, such that the recessed alignment structure 202 is a recessed region within the second substrate 220, extending from the first surface 221 of the first substrate 220.

Figure 2A:
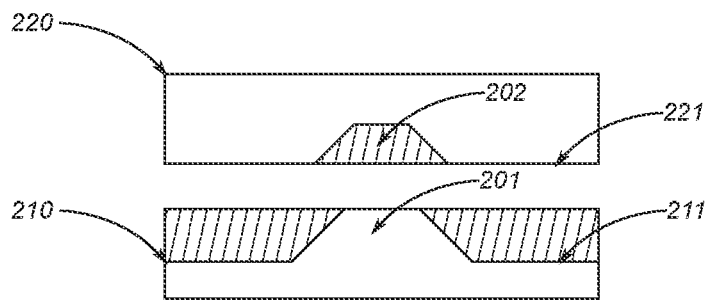
FIGS. 2A to 2D depict steps in the method of the present invention.

Steps 101 and 102 can be carried out in any order or simultaneously in separate processes. Steps 101 and 102 are illustrated in FIG. 2A, in which the lined sections indicate the areas of the first substrate 210 and second substrate 220 that are removed in the etching process.

At step 103, the raised alignment structure 201 is positioned opposite the recessed alignment structure 202 such that the first surface 211 of the first substrate 210 is opposite and parallel to the first surface 221 of the second substrate 220 and such that the raised alignment structure 201 is positioned at least partially within the recessed alignment structure 202.

The raised alignment structure 201 and recessed alignment structure 202 are shaped such that the raised alignment structure 201 extends at least partially within the recessed alignment structure 202 to a set depth. In this context, "extends at least partially within" means that at least part of the raised alignment structure 201 extends within the recessed alignment structure 202, i.e. extends below the plane of the first surface 221 of the second substrate 220. Furthermore, when the raised alignment structure 201 is positioned within the recessed alignment structure 202 at the set depth, movement of the first substrate 210 towards the second substrate 220 is restricted by the contact between the raised alignment structure 201 and recessed alignment structure 202 and relative movement of the first substrate 210 and second substrate 220 along at least one axis parallel to the first surfaces of the first and second substrates is also restricted by the contact between the raised alignment structure 201 and recessed alignment structure 202.

Figure 3:
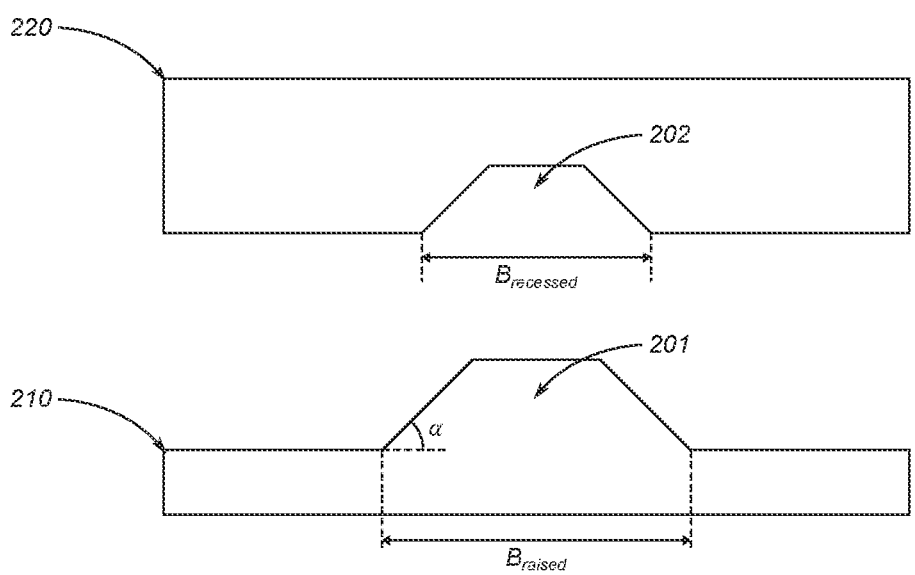
FIG. 3 is a cross-section view depicting the geometry of the raised and recessed alignment structures of the present invention.

The set depth to which the raised alignment structure 201 extends within the recessed alignment structure 202 is determined by the relative sizes of the raised alignment structure 201 and the recessed alignment structure 202, as shown in FIG. 3. The raised and recessed alignment structures 201 and 202 preferably have trapezium-shaped cross-sections along at least one plane perpendicular to the first surfaces 211 and 221 of the first and second substrates 210 and 220. The longest base of the raised alignment structure 201 trapezium is longer than the longest base of the recessed alignment structure trapezium 202 and each leg of the raised alignment structure 201 trapezium is parallel to the adjacent leg of the recessed alignment structure 202 trapezium when the first surface 211 of the first substrate 210 is parallel to the first surface 221 of the second substrate 220. Preferably, the raised alignment structure 201 and recessed alignment structure 202 are isosceles trapezium-shaped.

Figure 4:
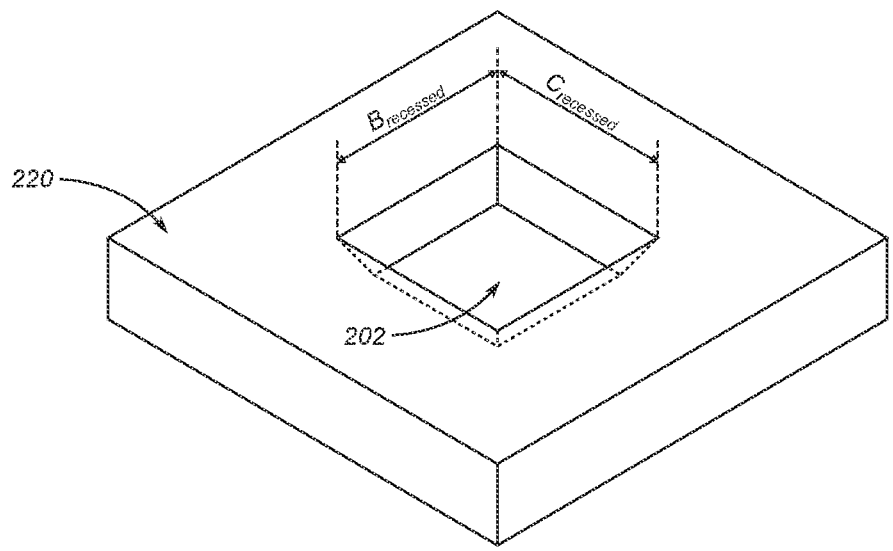
FIG. 4 is a perspective view depicting the geometry of the raised and recessed alignment structures of the present invention.
Figure 4:
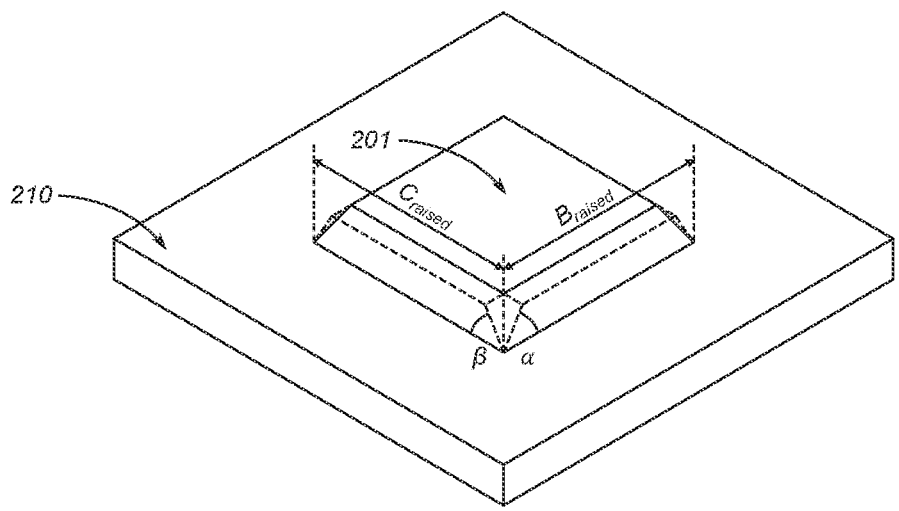

The final separation, d, between the first surface 211 of the first substrate 210 and the first surface 221 of the second substrate 220 when the substrates 210 and 220 are positioned and aligned such that the raised and recessed alignment structures 201 and 202 form a hard stop, i.e. when the raised alignment structure 201 is at the set depth within recessed alignment structure 202, is determined by the following equation:

$$d = \tan(\alpha)\frac{B_{raised} - B_{recessed}}{2}$$

where α is the interior angle between the legs and the longest base of each trapezium, $B_{raised}$ is the length of the longest base of the raised alignment structure and $B_{recessed}$ is the length of the longest base of the recessed alignment structure. This is shown in more detail in FIG. 3.

Where the raised and recessed alignment structure 201, 202 have trapezium cross-section in two perpendicular planes, i.e. when the raised alignment structure 201 and recessed alignment structure 202 are frustum-shaped, as shown in FIG. 4, wherein the dimensions of the raised alignment structure and recessed alignment structure obey the following equation:

$$d = \tan(\alpha)\frac{B_{raised} - B_{recessed}}{2} = \tan(\beta)\frac{C_{raised} - C_{recessed}}{2}$$

where d is the separation between the first surface of the first substrate and first surface of the second substrate when the raised alignment structure extends within the recessed alignment structure to the set depth, α is the interior angle between the legs and the longest base of the trapezia in along a first axis parallel to the first surfaces of the first and second substrates, $B_{raised}$ is the length of the longest base of the trapezium along the first axis of the raised alignment structure along and $B_{recessed}$ is the length of the longest base of the trapezium along the first axis recessed alignment structure, β is the interior angle between the legs and the longest base of the trapezia in along a second axis parallel to the first surfaces of the first and second substrates and perpendicular to the first axis, $C_{raised}$ is the length of the longest base of the trapezium along the second axis of the raised alignment structure along and $C_{recessed}$ is the length of the longest base of the trapezium along the second axis recessed alignment structure.

Etching the second substrate 220 to form a recessed alignment structure 202 may comprise forming a hardmask or resist on an upper surface of the second substrate 220, the hardmask or resist including at least one opening defining an open area of the second substrate 220, anistropically etching the second substrate via the opening in the hardmask or resist and removing the hardmask or resist. The size of the open area on the second substrate 220, and the etching time and/or the etchant concentration are controlled in order to control the dimensions of the trapezium/frustum shape of the recessed alignment structure 202.

When the first and second substrates 210, 220 are silicon substrates, anisotropic etching of the first and second substrates 210, 220 may be performed using TMAH and KOH-based solutions. Using silicon substrates with <100> crystal orientation, <110> directions (45° w.r.t. <100>) can be selectively etched with TMAH, while KOH solution etches <111> (54.7° w.r.t. <100>) selectively.

Multiple raised and recessed alignment structures 201, 202 may be formed on the same substrates and, where the substrates are wafers that will later undergo dicing, multiple may be formed on each individual die. Each substrate and/or die may include at least one pair of corresponding raised and recessed alignment structures 201, 202 in each quadrant of the substrate/die, e.g. one in each corner, in order to provide both lateral and perpendicular alignment. In a minimum case, each pair of dies may include three pairs of raised and recessed alignment structures in order to provide lateral and perpendicular alignment.

Figure 2B:
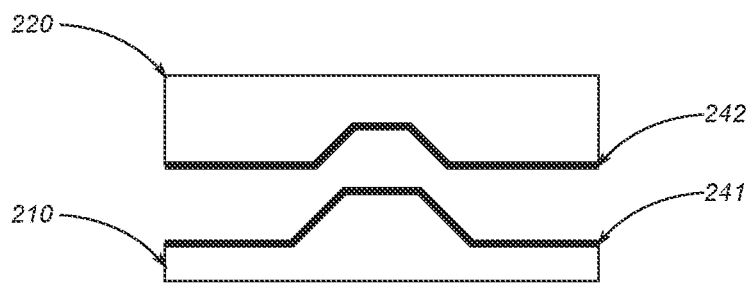
Figure 2C:
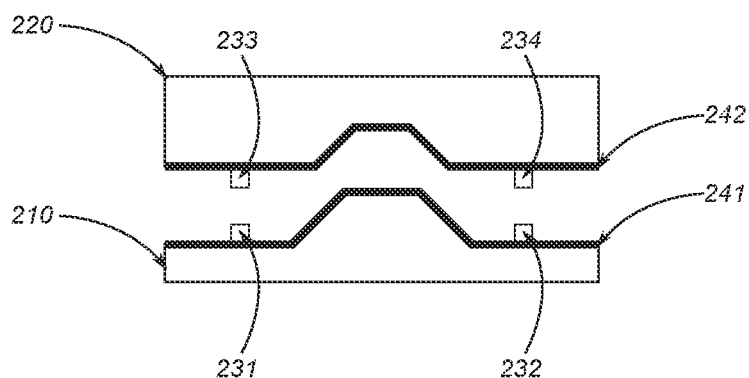
Figure 2D:
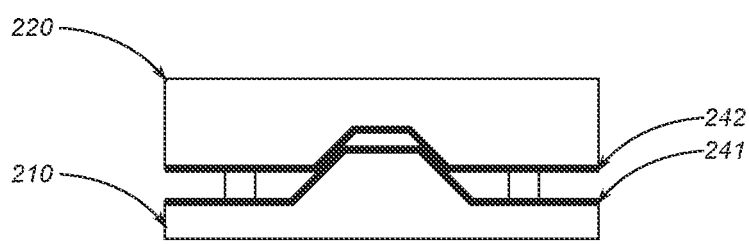

The method shown in FIG. 1 may also include, before positioning the raised alignment structure 201 opposite the recessed alignment structure 202, depositing a plurality of flip-chip bumps 231-234 on at least one of the first surface of the first substrate or first surface of the second substrate and/or an indium film on the raised alignment structure 201 and/or within the recessed alignment structure 202. Step 103 of positioning the raised alignment structure 201 opposite the recessed alignment structure 202 further may then further include bonding the first substrate to the second substrate via the flip-chip bumps or indium film. Bonding the first substrate to the second substrate may be thermocompression bonding. The use of flip chip bumps is shown in more detail in FIGS. 2B to 2C.

The height of the deposited flip chip bumps 231-234 is larger than the separation between the first surface 211 of the first substrate 210 and the first surface 221 of the second substrate 220 when the raised alignment structure 201 is positioned within the recessed alignment structure 202 at the set depth. Following compression bonding, the raised alignment structure 201 is positioned within the recessed alignment structure 202 at the set depth.

A further step of depositing a base metal layer 241 on the first substrate 210 and raised alignment structure 201 and a base metal layer 242 on the second substrate 220 and recessed alignment structure 202 may precede forming the flip chip bumps. The base metal layer may form the basis of further components that are fabricated on the substrates 210 and 220 and is patterned before step 103 of positioning the alignment structures 201, 202.

The method may include further steps for the fabrication of components on the substrates, for example forming quantum circuit components on the first and/or second substrate before the step of positioning the raised alignment structure opposite the recessed alignment structure.

Figure 5:
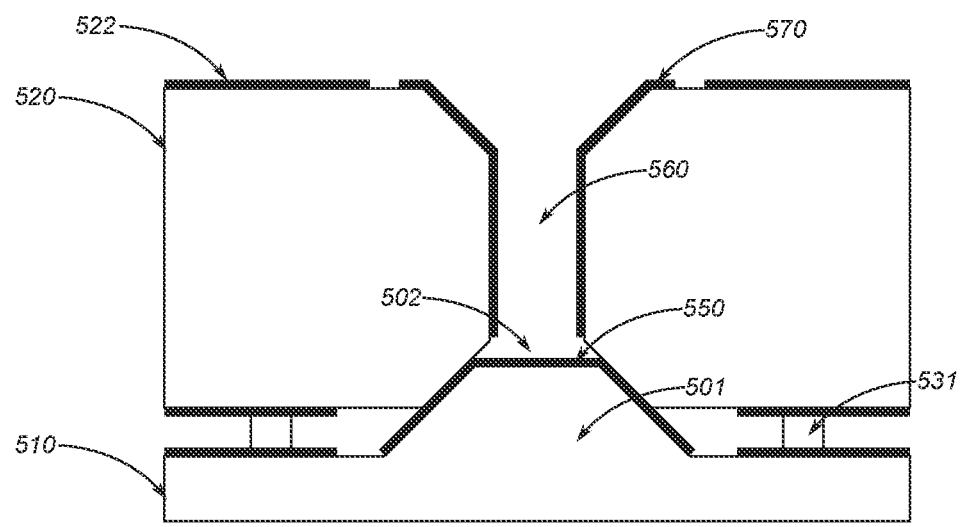
FIG. 5 is a cross-section view depicting a qubit and resonator structure according to a first embodiment of the present invention.

FIG. 5 shows an example of a qubit and readout structure formed on the first and second substrates 510, 520. In one further step, a qubit 550 is formed on the raised alignment structure 501. The qubit may be a Josephson junction-based qubit, such as a transmon qubit and is formed on the upper surface of the raised alignment structure. As the upper surface of the raised alignment structure is the original, polished surface of the substrate, it provides a particularly suitable location for the fabrication of sensitive superconducting components, such as Josephson junctions.

In another method step, a through-substrate via 560 is formed in the second substrate 520. The through-substrate via extends through the second substrate from the recessed alignment structure 502 to a second surface 522 of the second substrate 520. After the through-substrate via has been formed, the sidewalls of the through-substrate via 560 are metallized.

Forming the through-substrate via may include forming a hardmask or resist within the recessed alignment portion 502 and etching the through-substrate via through an opening in the hardmask or resist. The sidewall metallization is formed by chemical vapour deposition or physical vapour deposition before the hardmask or resist is removed, thereby leaving the sidewalls of the recessed alignment portion 502 free from metallization and preventing direct conductive contact between the metallization 570 and the qubit 550.

After the first substrate 510 and raised alignment structure 501 have been positioned opposite the second substrate 520 and recessed alignment structure 502, and when the raised alignment structure 501 extends within the recessed alignment structure 502, as shown in FIG. 5, the sidewall metallization 570 and qubit 550 each form electrodes of a capacitor. The sidewall metallization 570 may be connected to a resonator and readout structure fabrication on the second surface 522 of the second substrate 520.

In order to effectively control the total capacitance of the capacitor formed between qubit 550 and sidewall metallization 570, high-aspect ratio trenches, i.e. with a greater depth than width, may be formed in the second substrate surrounding the through-substrate via 560. The sidewalls of the trenches are metallized and connected to electrical ground.

Figure 6:
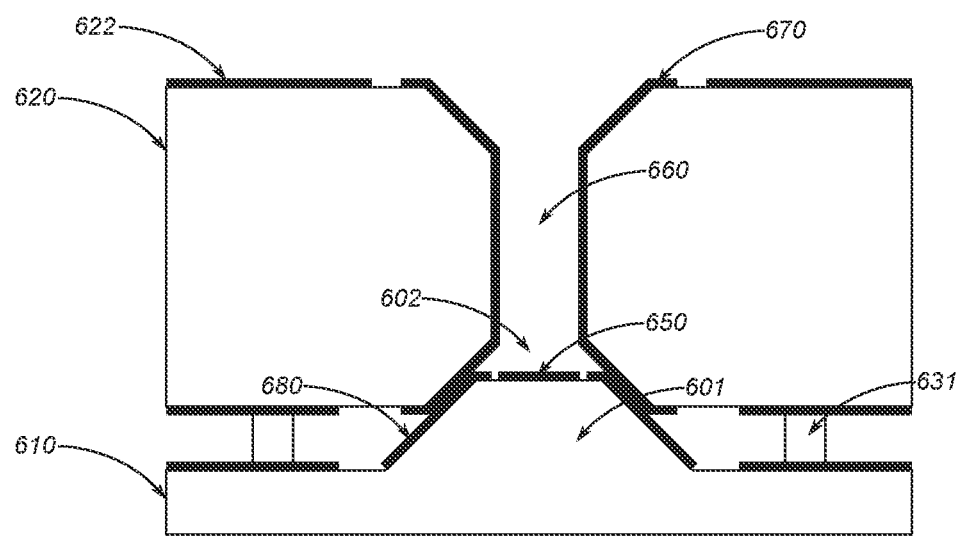
FIG. 6 is a cross-section view depicting a qubit and resonator structure according to a second embodiment of the present invention.

Alternatively, as shown in FIG. 6, the sidewall metallization 670 may be formed after removal of the hardmask or resist, such that the sidewalls of the recessed alignment structure 602 are also metallized. The qubit 650, formed on the upper surface of the raised alignment structure 601, is not conductively connected to metallization 680 that is also formed on at least the sidewalls of the raised alignment structure 601. After the first substrate 610 and raised alignment structure 601 have been positioned opposite the second substrate 620 and recessed alignment structure 602, and when the raised alignment structure 601 extends within the recessed alignment structure 602, as shown in FIG. 6, the metallization 680 on the sidewalls of the raised alignment structure 601 is in electrical contact with the metallization 670 on the sidewalls of the recessed alignment structure, and a capacitor is formed between the metallizations 670, 680 and the qubit 650.

Figure 7:
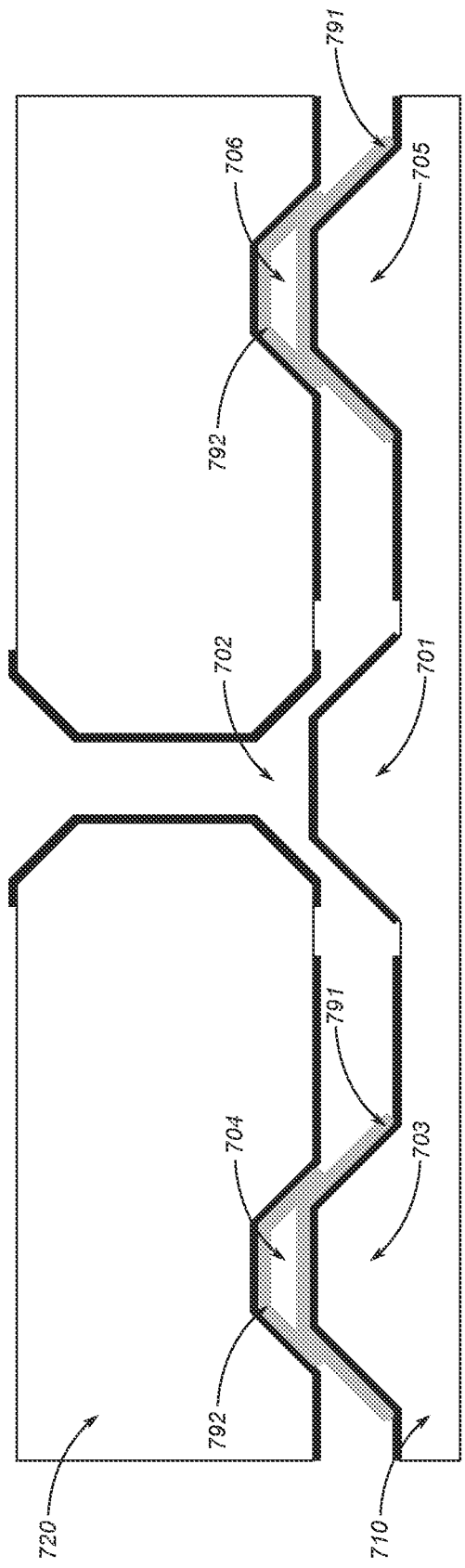
FIG. 7 is a cross-section view depicting device with tuneable substrate separation according to the present invention.

FIG. 7 shows a further alternative in which the separation between the first substrate 710 and second substrate 720, when the raised alignment structure is positioned within the recessed alignment structure at the set depth, is determined by the thickness of spacer material 791, 792 deposited over the raised alignment structures 703, 705 and/or the recessed alignment structures 704, 706. In the product shown in FIG. 7, the spacer material 791, 792 is deposited on raised and recessed alignment structures 703-706 and determines the separation between substrates 710, 720. By controlling the thickness of the spacer material, the separation can be tuned.

Figure 8:
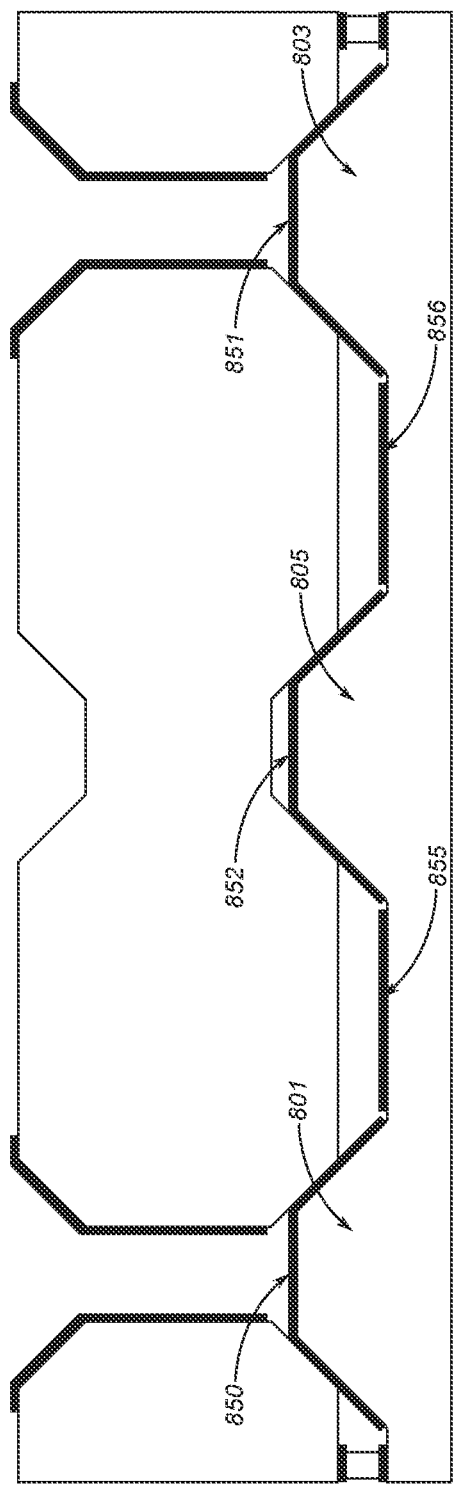
FIG. 8 is a cross-section view depicting coupled qubit and resonator structures according to the present invention.

FIG. 8 shows an embodiment in which multiple coupled qubits and resonators formed around raised alignment structures 801, 803 (such as those shown in FIG. 5 or 6), are coupled via an intermediate coupler 852, which is formed on raised alignment structure 805. The qubits 850, 851 are coupled to the coupler 852 by waveguides 855, 856. The coupler 852 may be a transmon used to selectively couple qubits 850, 851 rather than as a qubit.

The invention claimed is:

1. A method comprising:
    etching a first substrate to form a raised alignment structure that extends above a first surface of the first substrate;
    etching a second substrate to form a recessed alignment structure that extends below a first surface of the second substrate; and
    positioning the raised alignment structure opposite the recessed alignment structure such that the first surface of the first substrate is opposite and parallel to the first surface of the second substrate and such that the raised alignment structure is positioned at least partially within the recessed alignment structure;
    wherein the raised alignment structure and recessed alignment structure are shaped such that the raised alignment structure extends at least partially within the recessed alignment structure to a set depth and such that when the raised alignment structure is positioned within the recessed alignment structure at the set depth, movement of the first substrate is restricted towards the second substrate and relative to the second substrate along at least one axis parallel to the first surfaces of the first and second substrates, wherein the method further comprises, before the step of positioning the raised alignment structure opposite the recessed alignment structure, forming quantum circuit components on the first and/or second substrate, wherein forming quantum circuit components comprises:
    forming a qubit on the raised alignment structure;
    forming a through-substrate via in the second substrate, the through-substrate via extending through the second substrate from the recessed alignment structure to a second surface of the second substrate; and
    metallizing the sidewalls of the through-substrate via.

2. The method of claim 1, wherein:
    before positioning the raised alignment structure opposite the recessed alignment structure, the method further comprises depositing at least one of:
        a plurality of flip-chip bumps on at least one of the first surface of the first substrate or first surface of the second substrate; or
        an indium film on the raised alignment structure and/or within the recessed alignment structure,
    positioning the raised alignment structure opposite the recessed alignment structure further comprises bonding the first substrate to the second substrate via the flip-chip bumps or indium film.

3. The method of claim 2, wherein bonding the first substrate to the second substrate comprises thermocompression bonding, wherein the height of the deposited flip chip bumps is larger than the separation between the first surface of the first substrate and the first surface of the second substrate when the raised alignment structure is positioned within the recessed alignment structure at the set depth and wherein, following compression bonding, the raised alignment structure is positioned within the recessed alignment structure at the set depth.

4. The method of claim 1, wherein the cross sections of the raised alignment structure and recessed alignment structure along at least one plane perpendicular to the first surfaces of each substrate are trapezium-shaped such that the cross section of the raised alignment structure is a trapezium extending from the first surface of the first substrate and the cross section of the recessed alignment structure is trapezium extending into the first surface of the second substrate.

5. The method of claim 1, wherein etching a first substrate to form a raised alignment structure comprises forming multiple raised alignment structures on the first substrate and the step of etching a second substrate to form a recessed alignment structure comprises forming multiple recessed alignment structures on the second substrate.

6. The method of claim 5, wherein the multiple raised alignment structures are arranged on the first substrate and the multiple recessed alignment structures are arranged on the second substrate such that positioning the raised alignment structure opposite the recessed alignment structure comprises positioning each raised alignment structure opposite of the recessed alignment structures such that each raised alignment structure extends at least partially within the opposite recessed alignment structure to the set depth.

7. The method of claim 1, wherein the method further comprises:
forming multiple raised alignment structures and multiple recessed alignment structures, wherein:
forming a qubit on the raised alignment structure comprises forming qubits on a first subset of the raised alignment structures;
forming a through-substrate via comprises forming through-substrate vias extending from a first subset of the recessed alignment structures, the first subset of recessed alignment structures comprising the recessed alignment structures that are positioned opposite raised alignment structures in the first subset of raised alignment structures in the step of positioning; and
prior to positioning the raised alignment structure opposite the recessed alignment structure, depositing a layer of spacer material on a second subset of the raised alignment structure(s) and/or second subset of the recessed alignment structure(s).

8. The method of claim 7, wherein the distance between the first substrate and second substrate following positioning the raised alignment structures opposite the recessed alignment structures is determined at least in part by the thickness of the layer of spacer material deposited on the second subset of the raised alignment structure(s) and/or second subset of the recessed alignment structure(s).

9. The method of claim 1, wherein the method further comprises forming a metallization on at least the side walls of the raised alignment structure surrounding the qubit and wherein positioning the raised alignment structure opposite the recessed alignment structure further comprises placing the metallization on the sidewalls of the through-substrate via in electrical contact with the metallization on the sidewalls of the raised alignment structure.

10. The method of claim 1, wherein the method further comprises:
forming multiple raised alignment structures and multiple recessed alignment structures, wherein:
forming a qubit on the raised alignment structure comprises forming qubits on at least two of the raised alignment structures and forming a coupler on at least one of the raised alignment structures; and
forming connections elements connecting the at least two qubits to the at least one coupler;
wherein forming a through-substrate via comprises forming through-substrate vias extending from a subset of the recessed alignment structures, the subset of recessed alignment structures comprising the recessed alignment structures that are positioned opposite the raised alignment structures on which the qubits are formed.

11. A product comprising:
a first substrate comprising at least one raised alignment structure that extends above a first surface of the first substrate; and
a second substrate comprising at least one recessed alignment structure that extends below a first surface of the second substrate;
wherein the raised alignment structure is positioned opposite the recessed alignment structure such that the first surface of the first substrate is opposite and parallel to the first surface of the second substrate and such that the raised alignment structure is positioned at least partially within the recessed alignment structure;
wherein the raised alignment structure and recessed alignment structure are shaped such that the raised alignment structure extends at least partially within the recessed alignment structure to a set depth and such that movement of the first substrate is restricted towards the second substrate and relative to the second substrate along at least one axis parallel to the first surfaces of the first and second substrates; and
wherein the product comprises multiple raised alignment structure and multiple recessed alignment structures such that each raised alignment structure extends at least partially within the opposite recessed alignment structure to the set depth, wherein:
the product further comprises a qubit on the raised alignment structure;
a through-substrate via extends from the recessed alignment structure to a second surface of the second substrate; and
the sidewalls of the through-substrate via are metallized.

12. The product of claim 11, wherein the product further comprises:
a plurality of flip chip bumps connecting the first surface of the first substrate and the first surface of the second substrate; and/or
an indium film on the raised alignment structure and/or within the recessed alignment structure.

13. The product of claim 11, wherein the cross sections of the raised alignment structure and recessed alignment structure along at least one axis parallel to the first surfaces of each substrate are trapezium-shaped such that the cross section of the raised alignment structure is a trapezium extending from the first surface of the first substrate and the cross section of the recessed alignment structure is a trapezium extending into the first surface of the second substrate.

14. The product of claim 11, wherein at least one raised alignment structure and at least one recessed alignment structure is present in each quadrant of the substrate.

15. The product of claim 11, wherein the product comprises multiple raised alignment structures and multiple recessed alignment structures;
a qubit is located on each raised alignment structure in a first subset of the raised alignment structures;
through-substrate vias extend from a first subset of the recessed alignment structures, the first subset of recessed alignment structures comprising the recessed alignment structures that are positioned opposite raised alignment structures in the first subset of raised alignment structures; and
a layer of spacer material is located on a second subset of the raised alignment structure(s) and/or second subset of the recessed alignment structure(s).

16. The product of claim 15, wherein the distance between the first substrate and second substrate is determined by the thickness of the layer of spacer material located on the second subset of the raised alignment structure(s) and/or second subset of the recessed alignment structure(s).

17. The product of claim 11, wherein the product further comprises metallization on at least the side walls of the raised alignment structure surrounding the qubit and wherein the metallization on the sidewalls of the through-substrate via is in electrical contact with the metallization on the sidewalls of the raised alignment structure.

18. The product of claim 11, wherein:
a qubit is located on at least two of the raised alignment structures and a coupler is located on at least one of the raised alignment structures;
connection elements connect the at least two qubits to the at least one coupler;
through-substrate vias extend from a subset of the recessed alignment structures, the subset of recessed alignment structures comprising the recessed alignment structures that are positioned opposite the raised alignment structures on which the qubits are located.

\* \* \* \* \*